(12) United States Patent
Swain et al.

(10) Patent No.: US 6,649,454 B1
(45) Date of Patent: Nov. 18, 2003

(54) METHOD FOR FABRICATING A CHARGE COUPLED DEVICE

(75) Inventors: Pradyumna Kumar Swain, Franklin Park, NJ (US); Vipulkumar Kantilal Patel, South Brunswick, NJ (US)

(73) Assignee: Sarnoff Corporation, Princeton, NJ (US)

( * ) Notice: Subject to any disclaimer, the term of this patent is extended or adjusted under 35 U.S.C. 154(b) by 215 days.

(21) Appl. No.: 09/709,927

(22) Filed: Nov. 10, 2000

(51) Int. Cl.[7] ............................................. H01L 21/339
(52) U.S. Cl. ........................ 438/146; 438/144; 438/60; 438/75
(58) Field of Search ................................. 438/144, 146, 438/60, 75; 257/216, 221

(56) References Cited

U.S. PATENT DOCUMENTS 5,516,716 A * 5/1996 Hawkins et al. ............. 438/144
5,763,286 A * 6/1998 Figura et al. ................ 438/255
6,300,160 B1 * 10/2001 America et al. .............. 438/75

* cited by examiner

Primary Examiner—Stephen D. Meier
Assistant Examiner—Christy Novacek
(74) Attorney, Agent, or Firm—William J. Burke

(57) ABSTRACT

A process for forming a portion of a charge coupled device (CCD) is described. More particularly, wells (105) are formed self-aligned under gate stacks (132, 134). By forming wells (105) self-aligned to respective first and second gates (107, 207) of gate stacks (132, 134), potential for misalignment is reduced. First gates (107) of gate stacks (132) may be coupled together, and second gates (207) of gate stacks (134) may be coupled together, and these first and second gates (107, 207) may be coupled to respective signal sources (23, 24) to form a two-phase CCD.

20 Claims, 3 Drawing Sheets

METHOD FOR FABRICATING A CHARGE COUPLED DEVICE

The invention relates to formation of charge coupled devices and, more particularly, the invention relates to fabrication of two-phase charge coupled devices.

BACKGROUND OF THE DISCLOSURE

Owing to the cost competitive nature of charge coupled device (CCD) manufacture, it is desirable to provide a high yield, low cost process. Accordingly, two-phase CCDs, having the advantage over three-phase CCDs in manufacturability, speed and resolution, are being manufactured.

One conventional structure of a two-phase CCD is shown in FIG. 1. FIG. 1 depicts a cross-sectional view of a portion of a semiconductor device assembly 20 for a two-phase CCD coupled to signal sources 23 and 24. Signal source 23 and signal source 24 are phase one and two, respectively, and are coupled to gates 21 and 22 with lines 18 and 19, respectively.

Conventionally, semiconductor device assembly 20 is formed on a p-type single crystalline Silicon substrate 10. A n-type implant is used to form buried channel layer (bccd) 11 in substrate 10. Next, a dielectric layer 14 is grown or deposited, after which a conductive layer 16 is deposited over dielectric layer 14. Layers 14 and 16 are etched to form spaced-apart device stacks. After forming gate stacks 21, n-minus wells 13 are formed by implanting a p-type material. Accordingly, bccd 11 comprises n regions 12 and n-minus wells 13 in an alternating sequence. Next, a dielectric layer 15 is formed, conventionally by thermial oxidation whereby a portion of layer 21 is consumed. Next, conductive layer 17 is deposited, and gates 22 are formed. Unfortunately, in the process of removing selected portions of conductive layer 16, remnants, known in the semiconductor industry as "stringers" or "slivers", are sometimes left behind. These remnants can cause gates 21 to be electrically shorted to one another. Because respective gates 21 are to be electrically separate from one another for a two-phase CCD of the configuration shown in FIG. 1, and because shorting due to stringers or slivers is not typically repairable after forming gates 22, CCD yield is adversely affected.

To address this problem, an alternative structure and process for fabrication of a two-phase CCD is described with reference to FIG. 2. FIG. 2 depicts a cross-sectional view of a portion of a semiconductor device assembly 30 for a two-phase CCD. In the alternative structure, gates 21 are connected to one another and to signal source 23 by lines 18A, and gates 22 are connected to one another and to signal source 24 by lines 19A, as illustratively shown in FIG. 2. Accordingly, shorting together of gates 21 from layer 16 remnant formation is not at issue in device assembly 30.

Marks, not shown, may be made on a semiconductor wafer for registration between the wafer and lithographic equipment, such as a stepper or a step and scan. However, this approach is often dependent on metrological limitations and may require having machine associations with respect to a particular piece of lithographic equipment, and this limits fabrication throughput when the associated piece of lithographic equipment is not readily available. Accordingly, if gates 21 are misaligned, yield is reduced possibly owing to charge trapping or malformation of the device, the CCD may operate in a less than optimal manner.

Therefore, a need exists in the art for a more robust process for forming this alternative structure for a two-phase CCD.

SUMMARY OF THE INVENTION

The present invention provides a process for forming a portion of a semiconductor device on a substrate. More particularly, a buried channel layer is formed on the substrate, and a sacrificial layer is deposited over the buried channel layer and patterned to provide spaced-apart rows. A mask is formed extending part way between the rows, and wells are formed in the buried channel layer between the rows using facing sides of the rows and the mask. The mask is removed, and gate stacks between the rows are formed prior to removing the rows. Another mask extending part way between the gate stacks is formed, and other wells are formed in the buried channel layer between the gate stacks using facing sides of the gate stacks and the other mask prior to removing the other mask. Other gate stacks are formed between the existing gate stacks.

Accordingly, it should be appreciated that an aspect of the present invention provides for topological alignment or "self-aligned" formation of wells in a buried channel layer. Because these wells are formed in a self-aligned manner, there is less chance for misalignment.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
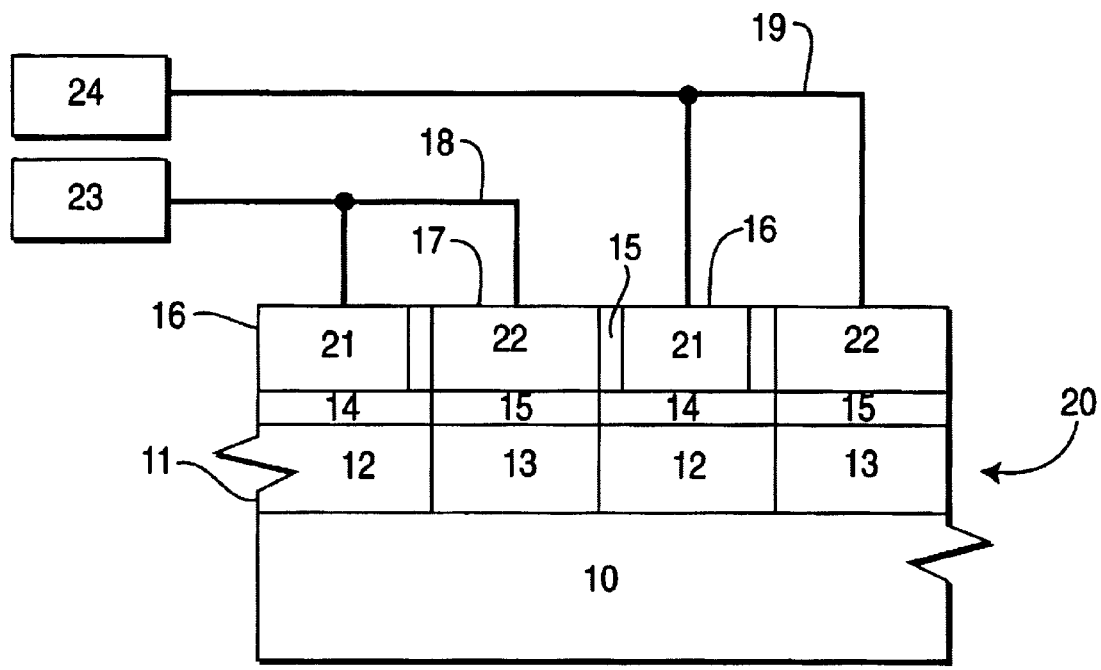
FIG. 1 depicts a portion of a conventional semiconductor device assembly in cross section.
Figure 2:
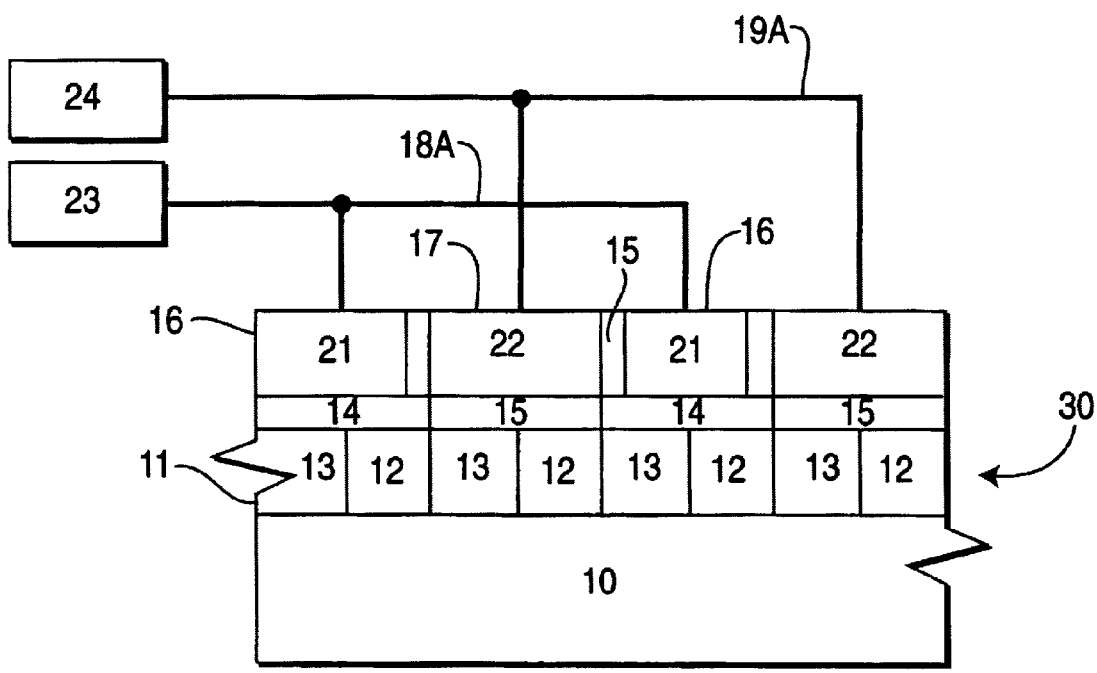
FIG. 2 depicts an alternative embodiment of a portion of a conventional semiconductor device assembly in cross section.
Figure 3:
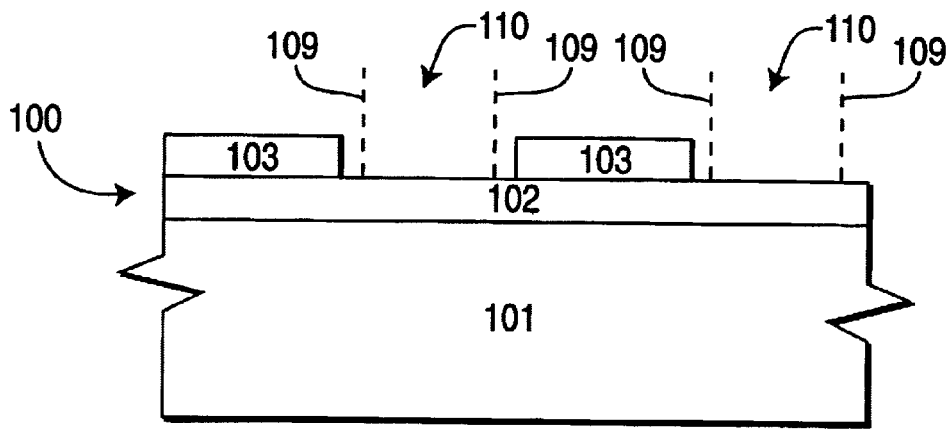
FIGS. 3 through 6 depict progressive cross-sectional views of exemplary portions of a process for fabricating a semiconductor device assembly in accordance with aspects of the present invention.

Referring to FIG. 3, there is shown a cross-sectional view of an exemplary portion of an in process charge coupled device (CCD) assembly 100. Substrate 101, which may be formed of an n- or p-type formed slice of single crystalline silicon, has a channel layer 102. Channel layer 102 will be of an opposite type of conductivity from substrate 101, namely either n- or p-type For purposes of clarity, a p-type substrate will be described with an n-type channel layer; however, those of ordinary skill in the art will appreciate that a n-type substrate with a p-type channel layer may be used.

Channel layer 102 is implanted to provide a buried channel layer (bccd). This process implants an n-type material with a concentration and power sufficient to make bccd layer 102 n-type to a depth sufficient to accommodate n-type regions for operation of CCD gate stacks.

Sacrificial layer 103 is formed over bccd layer 102. Notably, a native oxide layer may form on bccd layer 102 during processing. Thus, it should be understood that sacrificial layer 103 need not be in direct contact with bccd layer 102. Sacrificial layer 103 is patterned and etched to remove portions leaving spaced-apart sacrificial layer portions 103. These spaced-apart portions should be made of a material selective to a material employed for subsequent gate formation, namely to facilitate removal of sacrificial layer portions 103 while leaving gates, and should be sufficiently tall to block implantation, a conventional height to block implants is approximately 0.2 to 1.0 microns (2,000 to 10,000 Angstroms) dependent on implant material and power and sacrificial layer material. Sacrificial layer 103 may be grown or deposited single layer or a combination of layers for this purpose; for example sacrificial layer 103 may be an oxide, nitride, carbide, polycrystalline silicon ("poly" or "polysilicon"), or a combination thereof.

After patterning and etching of sacrificial layer 103, remaining sacrificial layer portions bracket or mark channel regions 110. Channel regions 110 have a middle section as indicated by dashed lines 109. This middle section is limited by width needed form-type regions for operation of CCD gate stacks, as well as width needed for forming a barrier to limit electrical conductivity between n-type regions.

Figure 4:
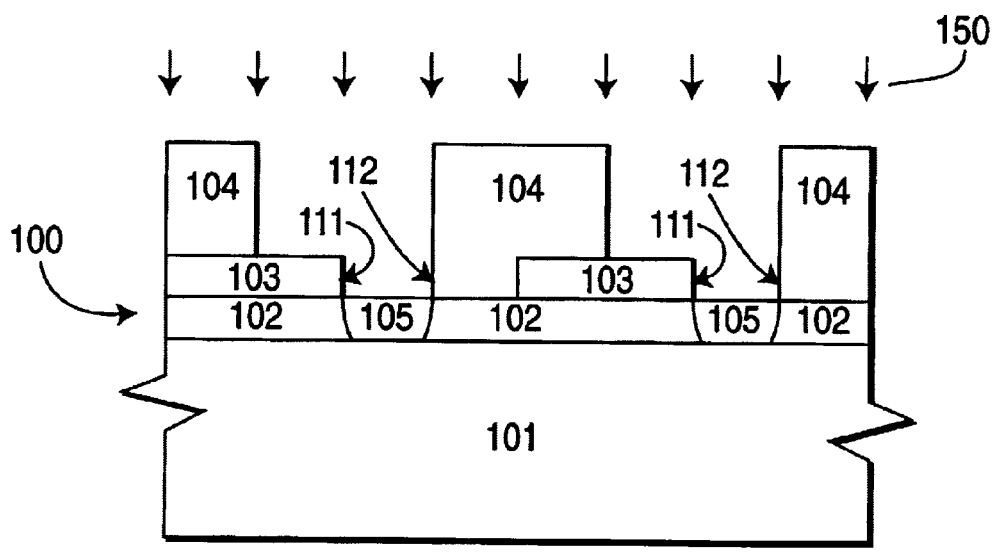

Referring to FIG. 4, resist 104 is deposited and patterned to provide a barrier mask for implantation 150. A light concentration of a p-type species, namely a p minus species, is used for implantation 150 to form wells 105. This implantation may be through any native oxide formed in channel region 110. Wells 105 provide electrical conductivity barriers between n-type regions of bccd layer 102 and have an n-minus type electrical conductivity characteristic. By way of example and not limitation, wells 105 may be approximately 1 to 1.5 microns deep.

Side or edge 112 of resist mask 104 faces side or edge 111 of sacrificial layer 103. Edge 112 extends into a middle section shown in FIG. 3. Edge 111 is an important edge for alignment, as space currently occupied by sacrificial layer 103 will be occupied by at least a portion of a gate stack. Accordingly, formation of well 105 is self-aligned to edge 111 on one side and to edge 112 on an associated side. After implantation 150, resist mask 104 is removed.

Figure 5:
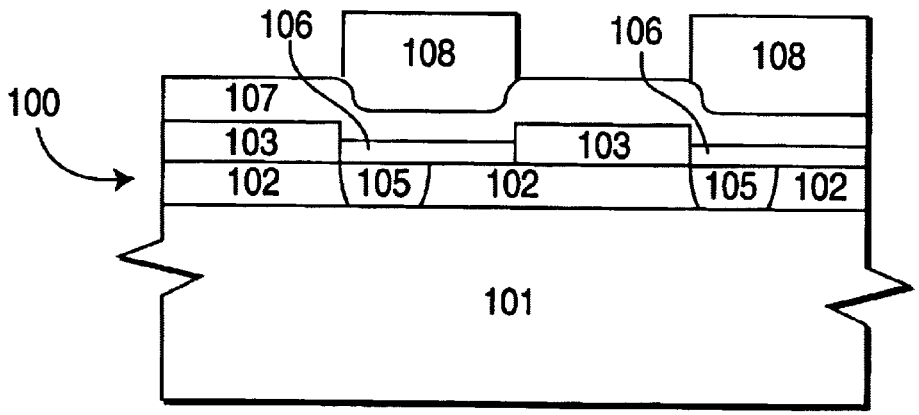

Referring to FIG. 5, gate dielectric layer 106 is formed over wells 105 in channel region 110 shown in FIG. 3. Dielectric layer 106 material may be selective to sacrificial layer material 103, so it remains after removal of sacrificial layer 103. An oxide or a nitride may be used for dielectric layer 106. For example, an oxide may be thermally grown or deposited, and more particularly may be thermally grown or deposited on a native oxide, if one exists, in channel region 110. For substrate 101 a silicon, thermal growth means formation of silicon dioxide.

Gate conductive layer 107 is formed over sacrificial layer 103 and gate dielectric layer 106. Though layer 107 is shown as being a substantially conformal deposition, it need not be. For example, a conductive fill material may be used to eliminate the need to remove portions of layer 107. However, in this illustrative embodiment, gate conductive layer 107 is a substantially conformal conductive material, such as conductive polysilicon.

As illustratively shown in FIG. 5, a layer of resist 108 may be spun on or otherwise deposited and then patterned. Gate conductive layer 107 is isotropically etched using etch mask 108 to remove portions of gate conductive layer 107. It is important to clear gate conductive layer 107 such that it does not overlap sacrificial layer 103. Accordingly and alternatively, to remove portions of gate conductive layer 107 over sacrificial layer 103, chemical-mechanical polishing or mechanical polishing may be used. After removal of portions of gate conductive layer 107, etch mask 108 may be removed.

Sacrificial layer 103 is removed by selective etching, namely layer 103 is removed while leaving at least a portion of a remaining portion of gates 107. During this etching process, a portion along edge 116 of gate dielectric layer 106 may be removed undercutting edge 151 of conductive gate layer 107.

Figure 6:
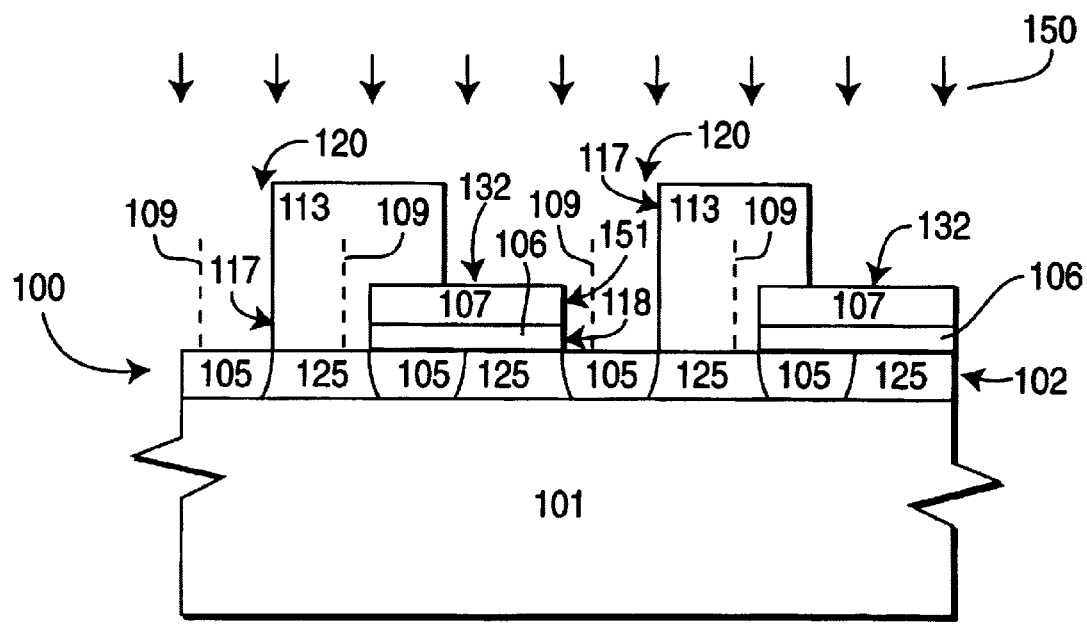

Referring now to FIG. 6, remaining portions of layers 106 and 107 mark or bracket channel regions 120. Resist layer 113 is deposited and patterned to provide an implant mask for implantation 150. Implantation 150 forms additional wells 105. Because substrate 101 is bccd layer 102 is n-type in this example, a p minus type implant is used to form n-minus type wells 105. Notably, edges 117 of resist mask 113 extend into middle sections, as indicated by dashed lines 109, of channel regions 120. Accordingly, these more recently formed wells are aligned to at least a portion of edges 151 of gate conductive layer 107, marking channel region 120 on one side and to at least a portion of edges 117 marking channel region 120 on an associated side.

Accordingly, at this point in this description it should be appreciated that wells 105 are aligned to respective sides of gate stacks 132, though those wells 105 under gates stacks 132 were aligned using sides of sacrificial layer 103. Wells 105 bracket n-type buried channel regions 125 of bccd layer 102, as shown in FIG. 7.

Figure 7:
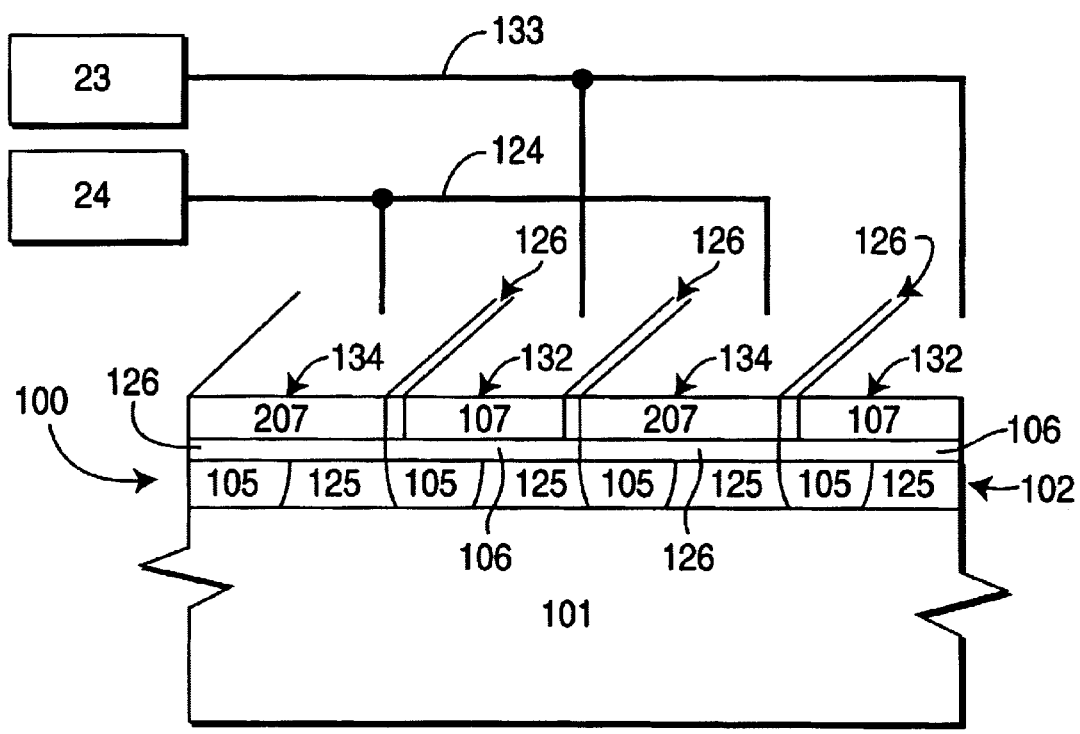
FIG. 7 depicts a three-dimensional cross-sectional view of an exemplary portion of the in process semiconductor device assembly with line drawn contacts and conductive lines.

Referring to FIG. 7, dielectric layer 126 is formed over bccd layer 102 in channel regions 120 (indicated in FIG. 6). Layer 126 may be a thermally grown oxide, such as silicon dioxide, and may consume a portion of bccd layer 102 or a portion of gate conductive layers 107 or portions of both. Gate conductive layers 207 are formed over, as well as between, dielectric layers 126. Gates 207 may be a polysilicon conformally deposited and then chemically-mechanically polished back to provide gate stacks 134. Gates of stacks 132 and 134 are electrically separate from one another by dielectric layers 126.

Rows of gate stacks 132 and 134 may be connected to conductive lines 133 and 124 for coupling to signal sources 23 and 24, respectively. Contacts and conductive lines may be formed in a single metal level or a double metal level in a known manner.

A CCD formed in accordance with the present invention may be formed in an array. An image may be focused on this array. Such a CCD array is useful to sense this image for converting it from one form of energy into an electrical representation thereof. Accordingly, such a CCD array may be used in a digital camera, digital video camera, and like devices used for capturing one or more images.

Although various embodiments which incorporate the teachings of the present invention have been shown and described in detail herein, those skilled in the art can readily devise many other varied embodiments that still incorporate these teachings. For example, an n-type substrate 101 may be used. In which embodiment, bccd layer 102 is formed by implanting a p-type species, and wells 105 are formed by implanting an n-minus species to form p minus wells 105.

What is claimed is:

1. A process for forming a portion of a semiconductor device on a substrate having a buried channel layer, comprising:

depositing a sacrificial layer over the buried channel layer;

patterning the sacrificial layer to provide spaced-apart rows;

forming a mask extending part way between the rows;

forming wells in the buried channel layer between the rows using facing sides of the rows and the mask;

removing the mask;

forming first gate stacks, after the formation of said wells, between the rows, wherein said first gate stacks comprise a dielectric layer and a conductive layer respectively;

removing the rows;

forming another mask extending part way between the first gate stacks;

forming other wells in the buried channel layer between the first gate stacks using facing sides of the first gate stacks and the other mask;

removing the other mask; and forming second gate stacks, after the formation of said other wells, between the first gate stacks, wherein said second gate stacks comprise a dielectric layer and a conductive layer respectively.

2. A process, as in claim 1, wherein the first and second gate stacks have gates electrically separate from one another by a dielectric layer formed when forming a portion of the second gate stacks.

3. A process, as in claim 1, wherein the first and second gate stacks each comprise a dielectric layer portion and a conductive layer portion.

4. A process for forming a portion of a charge coupled device (CCD), comprising:

providing a first layer, the first layer having a first electrical property;

forming a second layer to the first layer, the second layer having a second electrical property;

forming a third layer over the second layer;

removing portions of the third layer, the third layer portions remaining marking a first channel region therebetween;

forming a first mask, the first mask extending inwardly from one side of the first channel region into but not beyond a middle section of the first channel region;

forming a first well within the second layer, wherein the first well is aligned to the first channel region using the first mask and a side of the third layer, the first well having a third electrical property;

removing the first mask;

forming a first gate dielectric layer in the first channel region, after formation of said first well;

forming a first gate conductive layer over the first gate dielectric layer, after formation of said first well; p1 removing remaining portions of the third layer leaving stacks of the first gate conductive layer and the first gate dielectric layer, the stacks marking a second channel region;

forming a second mask, the second mask extending inwardly from one side of the second channel region into but not beyond a middle section of the second channel region;

forming a second well within the second layer, wherein the second well is aligned to the second channel region using the second mask and a side of a stack, the second well having a fourth electrical property;

removing the second mask;

forming a second gate dielectric layer, after the formation of said second well, in the second channel region and along a portion of the first gate conductive layer adjacent to the second channel region; and forming a second gate conductive layer, after the formation of said second well, over the second gate dielectric layer located in the second channel region.

5. The process of claim 4, wherein the third electrical property and the fourth electrical property have same or substantially same conductive properties.

6. The process of claim 4, wherein the first mask and the second mask each extend inwardly in a same direction into the first channel region and the second channel region respectively.

7. The process of claim 6, wherein the first well and the second well bracket a buried channel region of the second electrical property.

8. A process for forming a portion of a charge coupled device (CCD), comprising:

providing a p-type substrate platform;

implanting a n-type material into the p-type substrate platform to form a buried channel layer;

depositing a sacrificial layer over the buried channel layer;

patterning the sacrificial layer to provide spaced-apart sacrificial layer portions;

depositing a first resist layer;

patterning the first resist layer to implant a portion of the buried channel layer located between the spaced-apart sacrificial layer portions while leaving another portion of the buried channel layer located between the spaced-apart sacrificial layer masked-off from implantation, the first resist layer removed from one facing edge of each pair of the spaced-apart sacrificial layer portions;

implanting a first p-type material in the buried channel layer using the first resist layer pattern and the sacrificial layer portions to form first n-minus type regions in the buried channel layer, the first n-minus type regions formed self-aligned to the one facing edge of each pair of the spaced-apart sacrificial layer portions and the first resist layer;

removing the first resist layer;

forming a first gate dielectric layer between the spaced-apart sacrificial layer portions, after implantation of said first p-type material;

forming a first gate conductive layer over the first gate dielectric layer, after implantation of said first p-type material;

forming spaced-apart stacks from the first gate dielectric layer and the first gate conductive layer;

removing the sacrificial layer portions;

depositing a second resist layer;

patterning the second resist layer to implant a portion of the buried channel layer located between the spaced-apart stacks while leaving another portion of the buried channel layer located between the spaced-apart stacks masked-off from implantation, the second resist layer removed from one facing edge of each pair of the spaced-apart stacks;

implanting a second p-type material in the buried channel layer using the second resist layer pattern and the spaced-apart stacks to form second n-minus type regions in the buried channel layer, the second n-minus type regions formed self-aligned to the one facing edge of each pair of the spaced-apart stacks and the second resist layer;

removing the second resist layer;

forming a second gate dielectric layer between the spaced-apart stacks, after implantation of said second Type material; and forming a second gate conductive layer over the second gate dielectric layer, after implantation of said second p-type material.

9. A process, as in claim 8, wherein the first gate dielectric layer comprises silicon dioxide.

10. A process, as in claim 9, wherein the first gate conductive layer comprises polycrystalline silicon.

11. A process, as in claim 10, wherein the second gate dielectric layer comprises silicon dioxide.

12. A process, as in claim 11, wherein the second gate conductive layer comprises polycrystalline silicon.

13. A process for forming a portion of a charge coupled device (CCD), comprising:

providing a p-type substrate platform;

implanting a n-type material into the p-type substrate platform to form a buried channel layer;

depositing a sacrificial layer over the burled channel layer;

etching the sacrificial layer to form spaced-apart sacrificial layer portions, pairs of the spaced-apart sacrificial layer portions having facing sides, the facing sides each having a respective first channel region therebetween;

depositing a first resist layer over the sacrificial layer portions and the buried channel layer;

patterning the first resist layer to expose portions of the buried channel layer associated with first channel regions while leaving a remainder of the buried channel layer associated with the first channel regions unexposed;

implanting a first p minus type material in the buried channel layer using the first resist layer pattern and the sacrificial layer portions to form first n-minus type regions in the buried channel layer, each of the first n-minus type regions formed self-aligned to a facing side of the sacrificial layer portions and the first resist layer for forming each of the first n-minus type regions within the first channel regions;

removing the first resist layer;

growing a first gate dielectric layer in the first channel regions after implantation of said first p minus type material;

depositing a first gate conductive layer over the first gate dielectric layer and over the sacrificial layer portions after implantation of said first p minus type material;

depositing a second resist layer over the first gate conductive layer;

patterning the second resist layer to expose portions of the first gate conductive layer over the sacrificial layer portions and to leave the first gate conductive layer over the first channel regions unexposed;

etching the first gate conductive layer using the second resist layer pattern to form a first plurality of CCD gates;

removing the second resist layer pattern;

selectively etching to remove the sacrificial layer portions while leaving the first plurality of CCD gates, the first plurality of CCD gates bracketing second channel regions therebetween;

depositing a third resist layer over the first plurality of CCD gates and exposed portions of the buried channel layer;

patterning the third resist layer to expose portions of the buried channel layer associated with the second channel regions while leaving a remainder of the buried channel layer associated with the second channel regions unexposed;

implanting a second p minus type material in the buried channel layer using the third resist layer pattern and the first plurality of CCD gates to form second n-minus type regions in the buried channel layer, the second n-minus type regions formed self-aligned to edges of the first plurality of CCD gates adjacent to the second channel regions and the third resist layer disposed within the second channel regions;

removing the third resist layer;

growing a second gate dielectric layer in the second channel regions after implantation of said second p minus type material;

depositing a second gate conductive layer over the second channel regions and over the first plurality of CCD gates after implantation of said second p minus type material; and removing portions of the second gate conductive layer extending above the first gate conductive layer.

14. A process, as in claim 13, wherein the first gate dielectric layer comprises silicon dioxide.

15. A process, as in claim 14, wherein the first gate conductive layer comprises polycrystalline silicon.

16. A process, as in claim 15, wherein the second gate dielectric layer comprises silicon dioxide.

17. A process, as in claim 16, wherein the second gate conductive layer comprises polycrystalline silicon.

18. A process, as in claim 17, wherein the sacrificial layer is selected from an oxide, a nitride, a carbide, a polycrystalline silicon, or a combination thereof.

19. A process, as in claim 13, wherein the portions of the second gate conductive layer extending above the first gate conductive layer are removed by chemical-mechanical polishing.

20. A process, as in claim 19, wherein the first gate conductive layer is isotropically etched.

* * * * *